US009251000B2

(12) United States Patent
Varanasi

(10) Patent No.: US 9,251,000 B2
(45) Date of Patent: *Feb. 2, 2016

(54) APPARATUSES AND METHODS FOR COMBINING ERROR CODING AND MODULATION SCHEMES

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/525,602

(22) Filed: Oct. 28, 2014

(65) Prior Publication Data

US 2015/0074498 A1 Mar. 12, 2015

Related U.S. Application Data

(63) Continuation of application No. 13/415,422, filed on Mar. 8, 2012, now Pat. No. 8,892,986.

(51) Int. Cl.
| | | |
|---|---|---|
| *H03M 13/03* | (2006.01) | |
| *G06F 11/10* | (2006.01) | |
| *H03M 13/25* | (2006.01) | |
| *H03M 13/00* | (2006.01) | |

(Continued)

(52) U.S. Cl.
CPC ........ *G06F 11/1076* (2013.01); *G06F 11/1072* (2013.01); *H03M 13/1102* (2013.01); *H03M 13/255* (2013.01); *H03M 13/256* (2013.01); *H03M 13/6331* (2013.01); *H03M 13/4146* (2013.01)

(58) Field of Classification Search
CPC ............ H03M 13/255; H03M 13/256; H03M 13/2957; G06F 11/1072; G06F 11/1076
USPC ......... 714/795, 792, 780, 786, 794, 799, 758, 714/752, 52
See application file for complete search history.

(56) References Cited

U.S. PATENT DOCUMENTS

| 5,550,683 A | 8/1996 | Koren |
| 5,968,198 A | 10/1999 | Hassan et al. |

(Continued)

FOREIGN PATENT DOCUMENTS

| CN | 101567752 A | 10/2009 |
| JP | H04221464 | 8/1992 |

(Continued)

OTHER PUBLICATIONS

Jeon, Seungjune et al. "LDPC Codes for Memory Systems with Scrubbing", 2010 IEEE Global Telecommunications Conference, Dec. 6-10, 2010, Miami, Florida (6 pp.).

(Continued)

*Primary Examiner* — Christine Tu
(74) *Attorney, Agent, or Firm* — Brooks, Cameron & Huebsch, PLLC

(57) ABSTRACT

Methods and apparatuses for combining error coding and modulation schemes are described herein. One or more methods include encoding data using linear error correcting code, modulating the encoded data, writing the modulated data to memory, and decoding the written data using a Viterbi algorithm and a linear error correcting code decoder.

20 Claims, 3 Drawing Sheets

(51) Int. Cl.
*H03M 13/11* (2006.01)
*H03M 13/41* (2006.01)

(56) References Cited

U.S. PATENT DOCUMENTS

| | | | |
|---|---|---|---|
| 7,111,225 B2 | 9/2006 | Coene et al. | |
| 7,237,173 B2 | 6/2007 | Morita et al. | |
| 7,401,283 B2 | 7/2008 | Shen et al. | |
| 7,752,531 B2 | 7/2010 | Patapoutian et al. | |
| 7,848,465 B2 * | 12/2010 | Bliss | G11B 20/10009 375/341 |
| 7,907,359 B2 * | 3/2011 | Bliss | G11B 20/10009 360/29 |
| 8,051,358 B2 | 11/2011 | Radke | |
| 8,413,029 B2 | 4/2013 | Rauschmayer et al. | |
| 8,566,683 B2 | 10/2013 | Hekstra et al. | |
| 8,661,309 B2 | 2/2014 | Bliss et al. | |
| 8,892,986 B2 * | 11/2014 | Varanasi | G06F 11/1072 714/792 |
| 2006/0236197 A1 | 10/2006 | Lin et al. | |
| 2007/0002969 A1 | 1/2007 | Jeong et al. | |
| 2009/0245397 A1 | 10/2009 | Moffatt et al. | |
| 2010/0185906 A1 | 7/2010 | Rauschmayer et al. | |
| 2011/0113312 A1 | 5/2011 | Kobayashi et al. | |
| 2011/0167317 A1 | 7/2011 | Kim et al. | |
| 2011/0258509 A1 | 10/2011 | Ramamoorthy | |

FOREIGN PATENT DOCUMENTS

| | | |
|---|---|---|
| JP | H06231546 | 8/1994 |
| JP | H08235593 | 9/1996 |
| JP | 2000312234 | 11/2000 |
| JP | 2003051749 | 2/2003 |
| WO | 2007116275 | 10/2007 |
| WO | 2009531767 | 9/2009 |
| WO | 2009150707 | 12/2009 |
| WO | 2011059166 | 5/2011 |
| WO | 2011134977 A1 | 11/2011 |

OTHER PUBLICATIONS

Ungerboeck, Gottfried. "Channel Coding with Multilevel/Phase Signals", IEEE Transactions on Information Theory, vol. IT-28, No. 1, Jan. 1982, pp. 55-67.
Varanasi, Chandra. Copy of U.S. Appl. No. 13/106,118 (22 pp.).
Wang, Jiadong et al. "Soft Information for LDPC Decoding in Flash: Mutual-Information Optimized Quantization", Globecom 2011, Dec. 5-9, 2011, Houston, Texas (6 pp.).
Copy of International Search Report and Written Opinion for related PCT Application No. PCT/US2013/028678, mailed Jun. 19, 2013 (13 pages).
Notice of Rejection from related Korea Patent Application No. 10-2014-7027832, dated Jul. 21, 2015, 17 pp.
Office Action from related Taiwan patent application No. 102107431, dated May 25, 2015, 12 pp.
Office Action for related Japan Patent Office Application No. 2014-560983, dated Oct. 27, 2015, 7 pages.
Search Report and Written Opinion for related EP Patent Application No. 13757425.7, dated Nov. 10, 2015, 9 pages.
Langton, C., "Trellis Coded Modulation (TCM)", Intuitive Guide to Principles of Communications, dated Jan. 1, 2004, 35 pages, retrieved from http://www.complextoreal.com/chapters/tcm.pdf.
Qin Huang et al., "Error-Correcting Codes for Flash Coding", Information Theory and Applications Workshop, dated Feb. 6, 2011, pp. 1-23.

* cited by examiner

APPARATUSES AND METHODS FOR COMBINING ERROR CODING AND MODULATION SCHEMES

PRIORITY INFORMATION

This application is a Continuation of U.S. application Ser. No. 13/415,422, filed Mar. 8, 2012, the contents of which are incorporated herein by reference.

TECHNICAL FIELD

The present disclosure relates generally to semiconductor memory apparatuses and methods, and more particularly, to apparatuses and methods for combining error coding and modulation schemes.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices are utilized as volatile and non-volatile data storage for a wide range of electronic applications. Flash memory, which is just one type of memory, typically comprises a number of arrays of memory cells allowing for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

DETAILED DESCRIPTION

Figure 1:
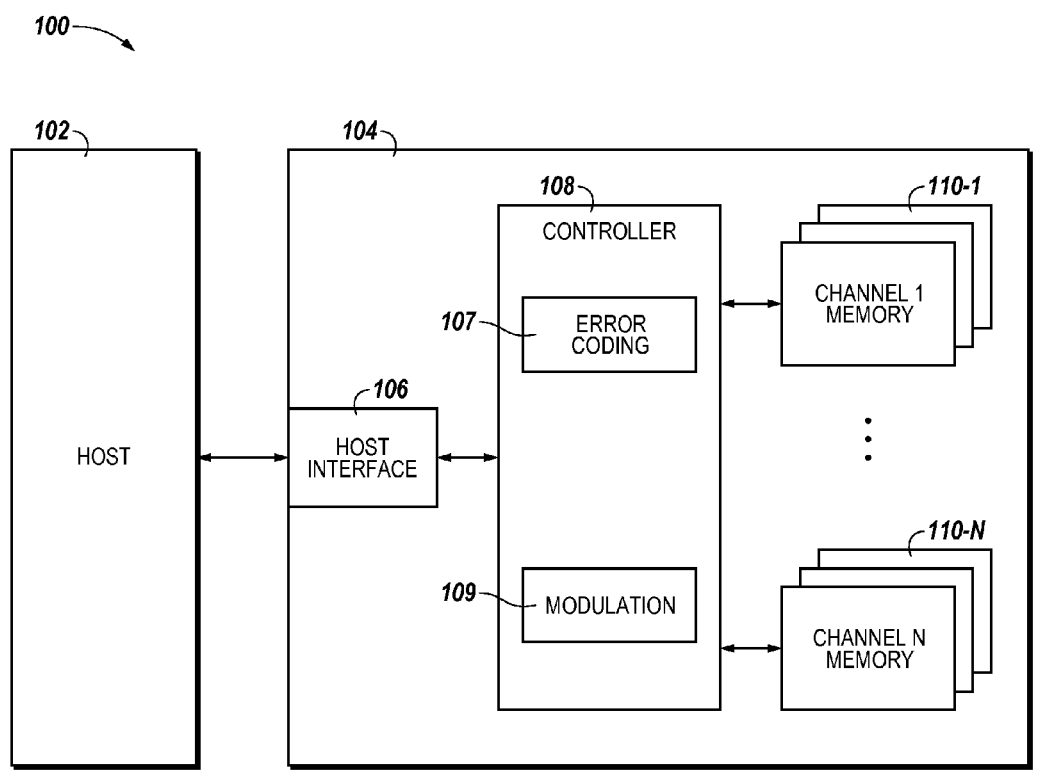
FIG. 1 is a block diagram of an apparatus in the form of a computing system including at least one memory system in accordance with a number of embodiments of the present disclosure.

Apparatuses and methods for combining error coding and modulation schemes are provided. One example method can include encoding data using linear error correcting code, modulating the encoded data, writing the modulated data to memory, and decoding the written data using a Viterbi algorithm and a linear error correcting code decoder.

Algebraic error-correction codes such as Bose, Chaudhuri, and Hocquenghem (BCH) codes can be used to correct a fixed number of errors in Flash data. Low-density parity-check (LDPC) codes can out-perform such BCH codes. For example, LDPC codes can be decoded with soft data (e.g., reliability information).

As storage density increases, the signal-to-noise ratio (SNR) associated with read operations can decrease, which can lead to a need for stronger error-correction codes to prevent read errors, for instance. One approach to increasing SNR includes expansion of a signal set via trellis-coded modulation (TCM), for instance. For example, expansion of the signal set can include converting binary data to multilevel data.

Embodiments of the present disclosure can provide increased SNR by combining LDPC and TCM. Embodiments can also effectively use soft data generated by a decoder in conjunction with soft data produced by a Viterbi component to increase SNR gain.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that one or more of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host (e.g., physical) interface 106, a controller 108 (e.g., a processor and/or other control circuitry), and a number of memory devices 110-1, . . . , 110-N (e.g., solid state memory devices such as NAND Flash devices), which provide a storage volume for the memory system 104. In another embodiment, the memory system 104 may simply be a single memory device.

As illustrated in FIG. 1, the controller 108 can be coupled to the host interface 106 and to the memory devices 110-1, . . . , 110-N via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the number of memory devices 110-1, . . . , 110-N (which in some embodiments can be a number of memory arrays on a single die) to control data read, write, and erase operations, among other operations. In some embodiments, the controller 108 can be on the same die or a different die than any or all of the number of memory devices 110.

Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., one or more integrated circuits) and/or software for controlling access to the number of memory devices 110-1, . . . , 110-N and/or for facilitating data transfer between the host 102 and memory devices 110-1, . . . , 110-N.

As illustrated in FIG. 1, the controller 108 can include an error coding component 107 (e.g., an encoder such as an error correction code (ECC) engine) and a modulation component 109 (e.g., for use in TCM). Each of the error coding component 107 and the modulation component 109 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the error coding component 107 and the modulation component 109 can be external to the controller 108 or have a number of components located within the controller 108 and a number of components located external to the controller 108.

The error coding component 107 can be configured to encode data (e.g., user data) received from host 102 and to be stored on (e.g., written to) a memory such as memory devices 110-1, . . . , 110-N. For instance, the user data can be encoded using a linear error correcting code such as an LDPC code, as is described in more detail herein.

The encoded data can have a code rate corresponding thereto. The code rate can refer to the proportion of the encoded data that is non-redundant. In a number of embodiments of the present disclosure, binary encoded data can be converted to a multilevel signal (e.g., a three-level signal). For instance, a signal set expansion from two to three can be used, which can increase the Euclidean distance between pairs of nearest signal sequences in the three-level domain, without code rate loss.

In a number of embodiments, the controller 108 can be configured to encode binary data using a linear error correcting code encoder, convert the binary data to multilevel data using a modulation scheme, write the multilevel data to memory, read data from the memory, and decode the read data using a Viterbi algorithm, and decode hard data and soft data generated by the Viterbi algorithm via a linear error correcting code decoder. The binary data can be encoded using LDPC code, and the modulation scheme used to convert the binary data can include TCM. The Viterbi algorithm can include a soft-output Viterbi algorithm (SOVA), and the linear error correcting code decoder can include an LDPC decoder. In a number of embodiments, the controller 108 can be configured to iteratively interchange soft data between the SOVA and the LDPC decoder. A SOVA can differ from a typical Viterbi algorithm in that it uses a modified path metric which takes into account the former probabilities of input symbols, and generates a soft output indicating a reliability of a decision. Additional functionality associated with the controller 108 is described in more detail herein.

The number of memory devices 110-1, . . . , 110-N can include a number of arrays of memory cells (e.g., non-volatile memory cells). The arrays can be Flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, . . . , 110-N of system 104) as a page of data, for example. As such, a page of data can be referred to as a data transfer size of the memory system. Data can be transferred to/from a host (e.g., host 102) in data segments referred to as sectors (e.g., host sectors). As such, a sector of data can be referred to as a data transfer size of the host.

Although a page of data can include a number of bytes of user data (e.g., a data payload including a number of sectors of data) as well as metadata corresponding thereto, a size of a page of data often can refer only to the number of bytes of the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data. The metadata can include integrity data such as error data (e.g., error detecting and/or correcting code data) and/or address data (e.g., logical address data), among other metadata corresponding to the user data.

Figure 2:
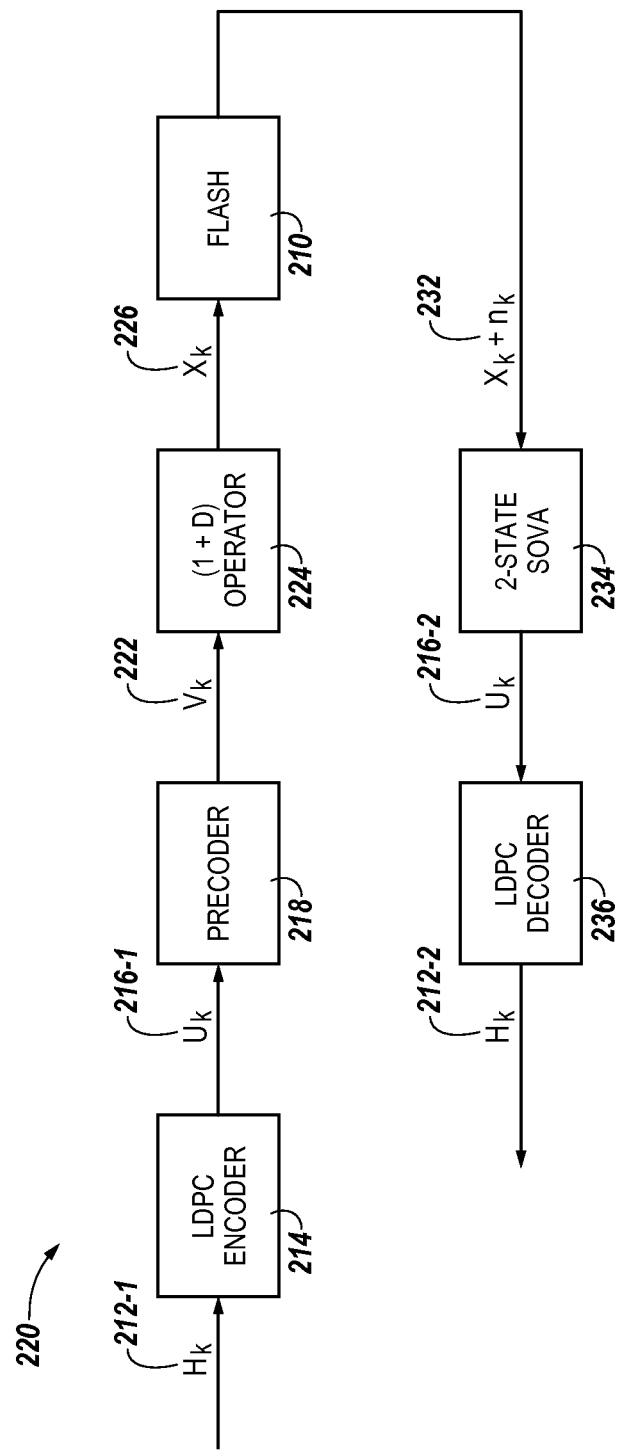
FIG. 2 is a functional block diagram that illustrates combining signal set expansion with low-density parity check (LDPC) code in accordance with a number of embodiments of the present disclosure.

FIG. 2 is a functional block diagram 220 associated with combining signal set expansion (e.g., TCM) with LDPC code, in accordance with a number of embodiments of the present disclosure. LDPC code can provide increased error correction capability as compared to algebraic error correction codes (e.g., BCH codes) and can also be decoded along with soft data, for instance.

In a number of embodiments, combining LDPC code with signal set expansion can result in SNR gain as compared to SNR achieved using only LDPC code or only signal set expansion. For example, binary LDPC code on a single level cell at a given rate without undergoing signal set expansion may increase SNR by a factor of approximately 7 with a given code rate loss. Similarly, non-LDPC code at a same or similar given rate that has undergone signal set expansion may increase SNR by a factor of 9 with a same or similar given code rate loss. However, in a number of embodiments, binary LDPC code at a same or similar given rate that has undergone signal set expansion (e.g., from two-level to three-level) may increase SNR by a factor of approximately 18 with the same or similar code rate loss.

FIG. 2 illustrates host data 212-1 (e.g., binary host data) $H_k$ received by a linear error correcting code encoder 214 (e.g., an LDPC encoder). The host data 212-1 is encoded via LDPC encoder 214 and the encoded data $U_k$ 216-1 is provided to a precoder 218. The precoder 218 performs a precoding operation on the encoded data 216-1.

As an example, the precoding operation can be a (1/(1 xor D) operation that converts binary encoded data (e.g., $U_k$ 216-1) to precoded data 222 (e.g., $V_k$). The precoded data $V_k$ output by the precoder 218 is received by an operator 224. The operator 224 can convert the binary precoded data $V_k$ to multilevel data 226 (e.g., $X_k$) via a (1+D) operation. As such, the signal set is expanded from the binary domain (e.g., two-level) to a multilevel domain (e.g., three-level). As an example, the $X_k$ data 226, which can be a three-level equivalent of the $U_k$ data 216-1, can be written to memory (e.g., Flash memory 210).

In the example operations, D can correspond to a delay of one unit. For example, in an operation, yn=xn+x(n−1), a current sample, xn, is added to a previous sample, x(n−1). This can be represented by the expression (1+D): that '1' standing for the sample in the present time instant (xn), and D standing for a delay of one unit (e.g., x(n−1)).

In the example illustrated in FIG. 2, the combination of the (1/(1 xor D)) precoding operation and the (1+D) operation are utilized in association with TCM, which results in the signal set expansion (e.g., conversion of the binary data to multilevel data). The signal set expansion can increase a Euclidean distance between pairs of nearest signal sequences in the three-level domain, for instance. In a number of embodiments, the signal set expansion can be accomplished without code rate loss associated with the LDPC. During signal set expansion (e.g., TCM), a multilevel trellis may be generated, which can include a number of states (e.g., a two-state, three-level trellis), an example of which is discussed in further detail with respect to FIG. 3.

Signal noise $n_k$ (e.g., $X_k+n_k$) associated with multilevel data $X_k$ can be read from memory 210 and decoded via a Viterbi component 234. In a number of embodiments, and as illustrated in FIG. 2, the Viterbi component 234 can be a SOVA (e.g., a two-state SOVA) capable of generating soft data (e.g., log likelihood ratios (LLRs)) corresponding to the read data 232. The soft data generated by the Viterbi component 234 can comprise LDPC code bits together with reliability metrics corresponding to those LDPC code bits. LLRs can be used to compare a fit of two models (e.g., a "0" and a "1" in a code sequence). For example, if the probability of a bit being a "0" is 0.7 and the probability of a bit being "1" is 0.3, the LLR is equivalent to log (0.7/0.3).

Decoded hard and soft data $U_k$ is output from the Viterbi component 234 and can be further decoded using an LDPC decoder 236. The resulting decoded host data $H_k$ 212-2 can be provided to a requesting entity (e.g., a host such as host 102 shown in FIG. 1). In a number of embodiments, the decoded host data 212-2 includes an increased SNR gain as compared to previous LDCP approaches, for instance.

In a number of embodiments, iterative soft-data interchange between the Viterbi component 234 and the LDPC decoder 236 can be introduced to further refine soft data associated with $U_k$ 216-2. For instance, the LDPC decoder 236 can also generate soft data (e.g., LLRs). For example, the LDPC decoder 236 can output soft data with the host data $H_k$ 212-2, and this soft data can be sent to the Viterbi component 234 for further decoding and then back to the LDPC decoder 236 (e.g., in an iterative process). In a number of embodiments, this iterative process can continue until the noise associated with data 216-2 is reduced to a desired threshold level, for instance.

Figure 3:
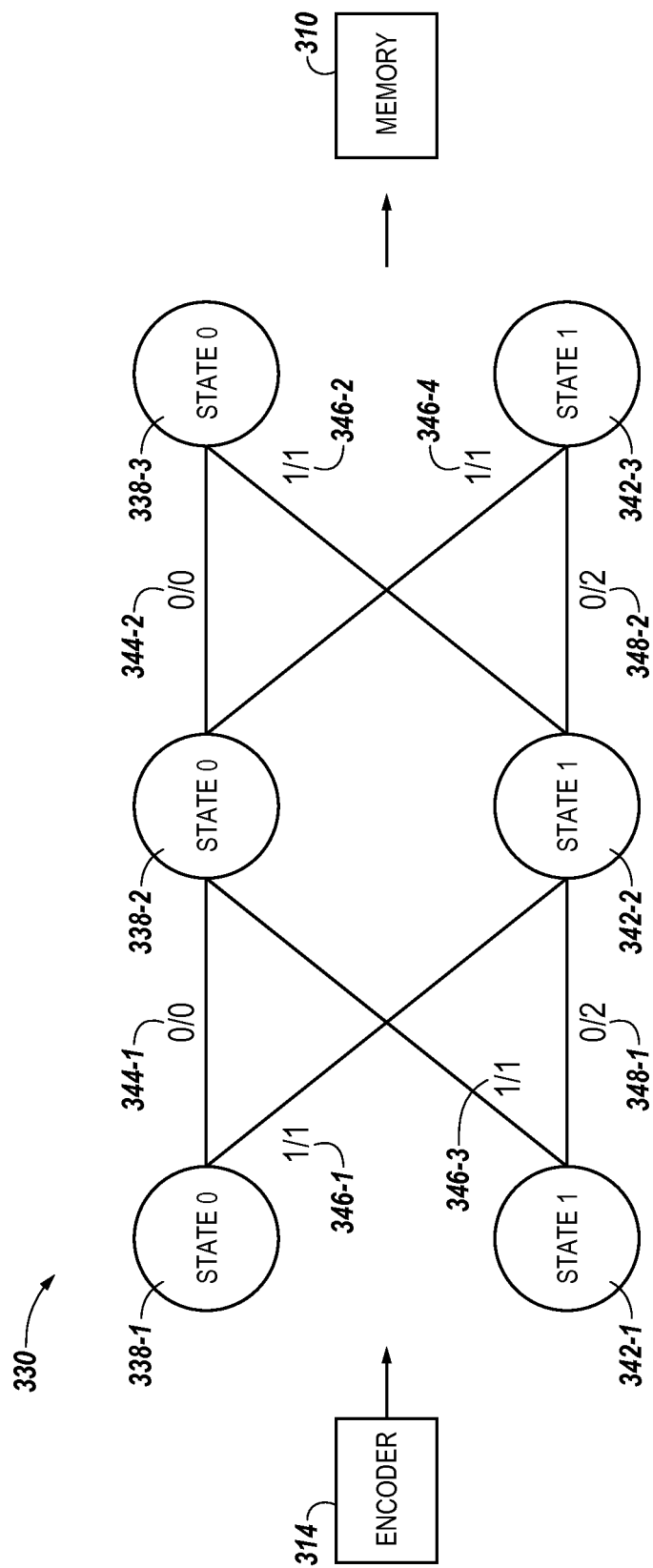
FIG. 3 illustrates a trellis generated in accordance with a number of embodiments of the present disclosure.

FIG. 3 illustrates a trellis 330 that can be generated in accordance with one of a number of embodiments of the present disclosure. As an example, trellis 330 can be generated via operations performed by components such as components 218 and 224 shown in FIG. 2. Trellis 330 is a two-state Viterbi trellis (e.g., state 1 and state 0) that can be utilized in a TCM modulation scheme, also referred to as trellis modulation. TCM can result in increased transmission efficiency as compared to other modulation schemes.

In the example illustrated in FIG. 3, an LDPC encoder 314 can be used to encode data (e.g., host data 212-1). The encoded data can undergo TCM such that the signal set is expanded (e.g., from a binary domain to a three-level domain). For instance, as described in connection with FIG. 2, a combination of a (1/(1 xor D)) operation and a (1+D) operation can be performed on the data output from 314, which can result in the signal expansion and generation of a trellis such as trellis 330. As a result, a squared Euclidean distance between two nearest three-level signal sequences in two-state trellis 330 can be twice that of the uncoded three-level signal sequences. In a number of embodiments, levels of trellis 330 can include voltage values of approximately −4 to 3 volts.

Trellis 330 includes two states including "state 0" (e.g., states 338-1, 338-2, and 338-3) and "state 1" (e.g., state 342-1, 342-2, and 342-3). Each line between states, as illustrated in FIG. 3, represents a sequence path, and each path is labeled with a bit (e.g., an LDPC encoder output bit) and a corresponding three-level signal. For example, paths 344-1 and 344-2 indicate a bit "0" with a corresponding three-level signal of "0". Similarly, for example, paths 348-1 and 348-2 indicate bits "0" and corresponding three-level signals of "2", whereas paths 346-1 . . . 346-4 indicate bits "1" with corresponding three-level signals of "1".

A three-level label-sequence on the edges of paths formed by a state sequence 0-0-0 can be given by 0-0 (e.g., paths 344-1 and 344-2), whereas a three-level label-sequence on the edges of paths formed by a state sequence 0-1-0 can be given by 1-1 (e.g., paths 346-1 and 346-2). In such an example, a squared Euclidean distance between the two paths equals 2. For example, $(1-0)^2+(1-0)^2=2$. Other path pairs will always have more distance between them).

Trellis 330 can include a level of the trellis having a particular relationship to at least one other level of the trellis. For example, binary user data $U_k$ 216 of FIG. 2 may be related to three-level data $X_k$ 226 based on a (1/(1 xor D)) operation performed via precoder 218 of FIG. 2 and a (1+D) operation performed by operator 224 of FIG. 2. The relationship achieved via such operations can result in robustness against noise (e.g., SNR gain) as compared to unexpanded signal sets (e.g., two-level, three-level, or four-level data) corresponding to levels that are independent of one another.

In FIG. 3, the values of the paths 344-1, 344-2, 346-1, 346-2, 346-3, 346-4, 348-1, and 348-2 represent $U_k/X_k$, with $U_k$ being binary data such as 216-1 shown in FIG. 2, and $X_k$ being modulated data (e.g., three-level data) such as data 226 shown in FIG. 2. For example, as will be discussed further herein, path 348-1 has a $U_k$ value of 0, an $X_k$ value of 2, and is labeled 0/2. These paths can correspond to possible paths taken by a sequence of levels, and this path information can be utilized by a Viterbi component (e.g., component 234 shown in FIG. 2) to identify a path that was used by the multilevel data as it passed through trellis 330, resulting in increased performance of the Viterbi component compared to the component having no path information.

As an example, consider binary user data $U_k$={1 0 0 1 0 1 0 1 1 . . . } received by a precoder, such as precoder 218 shown in FIG. 2. By performing a particular operation (e.g., a 1/(1 xor D) operation) on $U_k$, precoded data $V_k$ can be determined. For example, $V_k$=xor ($U_k$, $V_{k-1}$) results in $V_k$={1 1 1 0 0 1 1 0 1 . . . }.

Utilizing a (1+D) operator on $V_k$ can result in the generation of 3-level data $X_k$. For example, $X_k=V_k+V_{k-1}$ such that $X_k$={1 2 2 1 0 1 2 1 1 . . . }. As such, there is a relationship between the levels 0, 1, and 2 of trellis 330, particularly between $U_k$ and $X_k$, where if $U_k$=1, $X_k$=1. This relationship can result in increased SNR gain as compared to memory cells with levels independent of one another.

In the example above, if an even number of 1's is passed by in the $U_k$ sequence at a particular point in the sequence, then a $U_k$ value of 0 generates $X_k=0$, as in paths 344-1 and 344-2. This can be referred to as a state 0 (e.g., states 338-1, 338-2, and 338-3). If an odd number of 1's is passed by in the $U_k$ sequence at the particular point in the sequence, then a $U_k$ value of 0 generates $X_k=2$, as in paths 348-1 and 348-2. This can be referred to as a state 1 (e.g., states 342-1, 342-2, and 342-3).

Data output (e.g., multilevel data) from the TCM can be written to memory (e.g., Flash memory) 310 and sent to a SOVA for decoding, as illustrated at 232 of FIG. 2. In a number of embodiments, SNR gain may be realized by using a Viterbi algorithm on a trellis (e.g., trellis 330) to recover binary LDPC code bits from soft data read from memory (e.g., memory 310). The soft data may include approximations of the three-level signals (e.g., $X_k$) discussed with respect to FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory, the method comprising:
    modulating encoded data including:
        precoding the encoded data via a (1/(1 xor D)) precoder operation; and
        subsequently performing a (1+D) operation on the precoded data, wherein D corresponds to a delay of one unit,
            wherein data resulting from the (1+D) operation is modulated encoded data.

2. The method of claim 1, further comprising writing the modulated data to memory.

3. The method of claim 2, further comprising decoding the written data using a Viterbi algorithm and a linear error correcting code decoder.

4. The method of claim 1, wherein the encoded data is data encoded using low density parity check (LDPC) code.

5. The method of claim 1, wherein modulating the encoded data further includes performing trellis coded modulation (TCM) on the encoded data in association with the precoder operation and the (1+D) operation and generating a multilevel trellis during the performance of TCM.

6. The method of claim 5, wherein generating the multilevel trellis includes generating the multilevel trellis in response to the precoding of the encoded data and the performing of the (1+D) operation.

7. The method of claim 5, wherein generating the multilevel trellis includes generating a two-state, three-level trellis.

8. A method for operating a memory, the method comprising:
    modulating data read from the memory by precoding the read data via a (1/(1 xor D)) precoder operation and via a (1+D) operation performed on the precoded data, wherein D corresponds to a delay of one unit, and wherein the read data includes data encoded using linear error correcting code.

9. The method of claim 8, further comprising subsequently decoding the read data using a low-density parity check (LDPC) decoder and a soft-output Viterbi algorithm (SOVA).

10. The method of claim 9, wherein operating the memory further includes generating soft data from the LDPC decoder and iteratively interchanging the soft data between a Viterbi component and the LDPC decoder.

11. The method of claim 10, wherein iteratively interchanging the soft data between the Viterbi component and the LDPC decoder includes iteratively interchanging log likelihood ratios (LLRs).

12. The method of claim 9, wherein decoding the read data using a SOVA and an LDPC decoder further includes decoding the read data using a two-state SOVA.

13. The method of claim 8, wherein modulating the read data further includes expanding a signal set of the read data.

14. An apparatus, comprising;
    a controller coupled to a memory;
    an error correcting code encoder coupled to the controller and configured to encode binary data; and
    a modulation component coupled to the controller and configured to modulate the encoded binary data by precoding the encoded binary data via a (1/(1 xor D)) precoder operation, performing a (1+D) operation on the precoded data, wherein D corresponds to a delay of one unit, and expanding a signal set of the encoded binary data from a binary domain to a multilevel domain in response to the precoding and the performing the (1+D) operation.

15. The apparatus of claim 14, wherein the controller is configured to control:
    writing the modulated data to the memory; and
    reading the modulated data from the memory.

16. The apparatus of claim 15, wherein the controller is configured to control decoding the read modulated data using a Viterbi algorithm.

17. The apparatus of claim 16, wherein the controller is configured to control decoding hard data and soft data generated by the Viterbi algorithm using a low density parity check (LDPC) decoder.

18. The apparatus of claim 17, wherein the controller is configured to control iteratively interchanging the soft data between the Viterbi algorithm and the LDPC decoder.

19. The apparatus of claim 14, wherein the modulation component is further configured to expand the signal set using trellis coded modulation (TCM).

20. The apparatus of claim 14, wherein the error correcting code encoder is further configured to encode binary data using LDPC code.

\* \* \* \* \*